(12) United States Patent
Brownfield et al.

(10) Patent No.: US 6,399,902 B1
(45) Date of Patent: Jun. 4, 2002

(54) INLINE FLUX MEASUREMENT SYSTEM

(75) Inventors: Terri J. Brownfield, Boulder Creek; Jonathan D. Halderman, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 23 days.

(21) Appl. No.: 09/630,414

(22) Filed: Aug. 1, 2000

(51) Int. Cl.[7] .............. G01G 13/00; H01L 21/50; G06F 19/00; C23C 26/00; B23K 31/12
(52) U.S. Cl. ............ 177/60; 177/116; 702/173; 427/96; 222/55; 29/592.1; 438/106
(58) Field of Search .............. 702/173; 141/83; 177/1, 25.13, 60, 116, 119, 50; 222/77, 55; 29/592.1; 427/96, 97; 438/26, 106, 107, 108, 110

(56) References Cited

U.S. PATENT DOCUMENTS

| | | |
|---|---|---|
| 4,796,782 A | 1/1989 | Wales et al. .................. 222/57 |
| 4,976,377 A | 12/1990 | Higuchi et al. ................ 222/55 |
| 5,090,609 A | 2/1992 | Nakao et al. ................ 228/123 |
| 5,232,736 A * | 8/1993 | Tribbey et al. ................ 427/96 |
| 5,801,951 A | 9/1998 | Burns, II et al. ............. 222/52 |
| 5,909,057 A | 6/1999 | McCormick et al. ....... 257/704 |
| 5,953,623 A | 9/1999 | Boyko et al. ................ 438/612 |
| 5,970,319 A | 10/1999 | Banks et al. ................ 438/115 |
| 5,988,485 A | 11/1999 | Master et al. .......... 228/180.22 |
| 6,023,666 A * | 2/2000 | Jiang et al. .................. 702/173 |
| 6,043,429 A | 3/2000 | Blish, II et al. .......... 174/35 R |
| 6,061,608 A * | 5/2000 | Moldavsky .................. 222/55 |

OTHER PUBLICATIONS

Accujet Dispenser, brochure by Nordson Corporation, Feb. 1995.

* cited by examiner

Primary Examiner—Randy W. Gibson

(57) ABSTRACT

This invention is directed to controlling the amount of flux dispensed onto the surface of an IC component. The component is continually weighed and data is fed back to a controller that controls the dispensing of flux onto the IC component. When the proper amount of flux is dispensed, the controller terminates the dispensing of the flux.

10 Claims, 2 Drawing Sheets

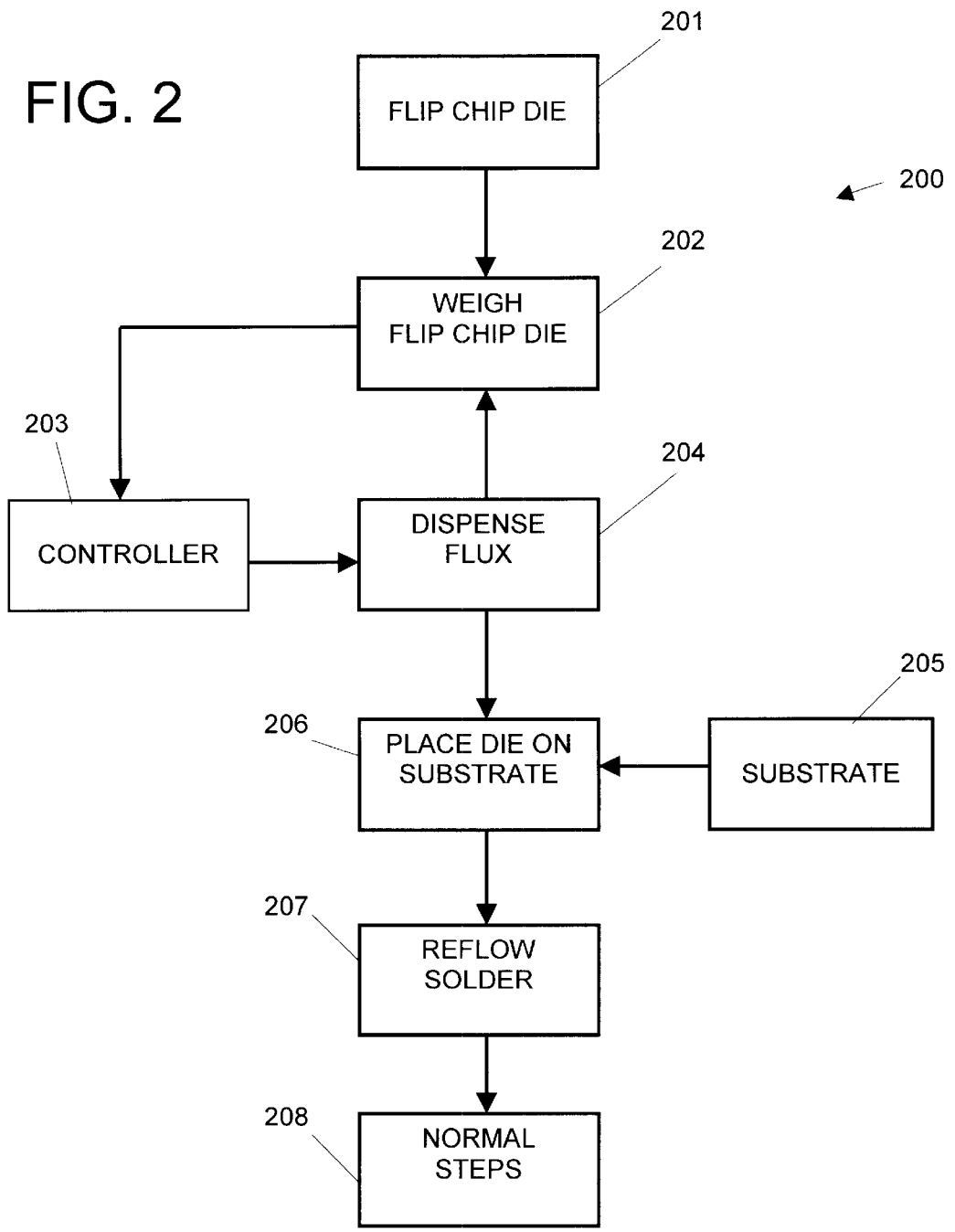

INLINE FLUX MEASUREMENT SYSTEM

The invention relates in general to the field of integrated circuit packaging, more particularly, the present invention provides for an apparatus and method for an inline measuring system controlling the volume of flux dispensed onto a semiconductor flip chip or a packaging substrate.

BACKGROUND OF THE INVENTION

In a semiconductor device assembly, a semiconductor IC chip or die may be bonded directly to a packaging substrate without the need for a separate leadframe or for separate I/O connectors, i.e., wire or tape. Such chips are formed with ball-shaped beads or bumps of solder affixed to I/O bonding pads on the chip. During packaging, the chip or die is flipped onto its active circuit surface so that the solder balls form electrical connections directly between the die and conductive traces on a packaging substrate. Semiconductor chips of this type are commonly called flip chips.

Flip-chip technology is well known in the art. A die having solder bumps formed on the active or front side of the die is inverted and bonded to the traces on a packaging substrate through the solder bumps. The bonding is accomplished by heating the flip-chip assembly to a temperature that causes the solder forming the bumps to reflow. A solder joint is formed between the die and the packaging substrate and a narrow gap formed between the die and the substrate. The packaging substrate usually a ceramic or polymer composite.

However, prior to bonding the die to a substrate, a solder flux such as a rosin or a no-clean flux is applied to either the active surface of the die or the packaging substrate surface. The flux serves primarily to remove any surface oxidation or natural oxide films on the surface of the solder, so that during reflow, the solder balls make good contact with traces on the packaging substrate. The solder is typically silver or lead combined with a more reactive metal such as indium or tin. During reflow of the solder, the flux is burned off. The flux must be removed because any remaining residue from the flux may alter the adhesion properties of the underfill material and may also pose a corrosion problem to the semiconductor chip. It is preferred that the flux be removed by heating during the reflow step. However, it is conventional in the industry to also use an organic solvent or aqueous solution to remove the flux.

Following the reflow of the solder and removal of the flux, the mechanical integrity of solder joints of the die to the packaging substrate and the reliability of the integrated package is enhanced by underfilling the gap between the die and the substrate with an underfill material. The underfill is a polymer, in liquid form, such as an epoxy or a plastic polymer. Typically, the underfill is dispensed around at least one adjacent side of the die and the underfill material flows by capillary action to fill the gap between the die and the substrate. The underfill is normally filled with ceramic particles to control its rheology in the uncured state and to improve its thermal and mechanical properties in the cured state. The diameter of the filler particles in the underfill are sized smaller than the height of the gap so as not to restrict flow. Typical formulations have a viscosity of about 10 Pa·s at the dispense temperature. After the underfill material is flowed into the gap, it is cured in an oven at an elevated temperature.

The conventional process dispensing flux onto an IC component involves an offline manual sampling technique to determine the amount of flux to be dispensed. The offline method involves the following steps. The assembly line is interrupted. A representative number of IC components from the assembly line are removed before the flux is dispensed. Each component is weighed and then placed back on the assembly line. Flux, as controlled by the controller, is dispensed onto the IC component. After the flux is dispensed, the component is removed from the assembly line and reweighed. A visual observation is made to determine whether too much or too little flux has been applied. After a representative number of samples have been taken, the controller is manually adjusted to control the amount of flux to be dispensed. Once the offline sampling is completed and the controller is adjusted, the assembly process is put back on line. After a period of time, the offline sampling is repeated again to determine if the controller needs adjustment. This process must be repeated frequently. There is a need to automate the dispensing means to eliminate the need for the frequent sampling and offline weighing of the IC components to adjust the controller.

SUMMARY OF THE INVENTION

The object of this invention is to provide an apparatus for dispensing a flux onto an IC component to eliminate the need for offline manual weighing of the component before and after the flux is dispensed.

A further object of the invention is to provide an apparatus for dispensing a flux onto an IC component to control the amount of flux dispensed onto the IC component to prevent an excess of flux from being dispensed.

Another object of the invention is to provide a method for dispensing a flux onto an IC component to eliminate the need for offline manual weighing of the component before and after the flux is dispensed.

And still a further object of the invention is to provide a method for dispensing a flux onto an IC component to control the amount of flux dispensed onto the IC component to prevent an excess of flux from being dispensed.

The other objects and characteristics of the present invention will become apparent from the further disclosure of the invention which is given hereinafter with reference to the accompanying drawings.

BRIEF DESCRIPTION OF THE DRAWINGS

The drawing figures schematically illustrates the apparatus and methods of the invention.

FIG. 2 is a block diagram for a description of the flow process for applying flux to a flip-chip die using the inline flux measuring system.

DETAILED DESCRIPTION OF THE INVENTION

Figure 1:
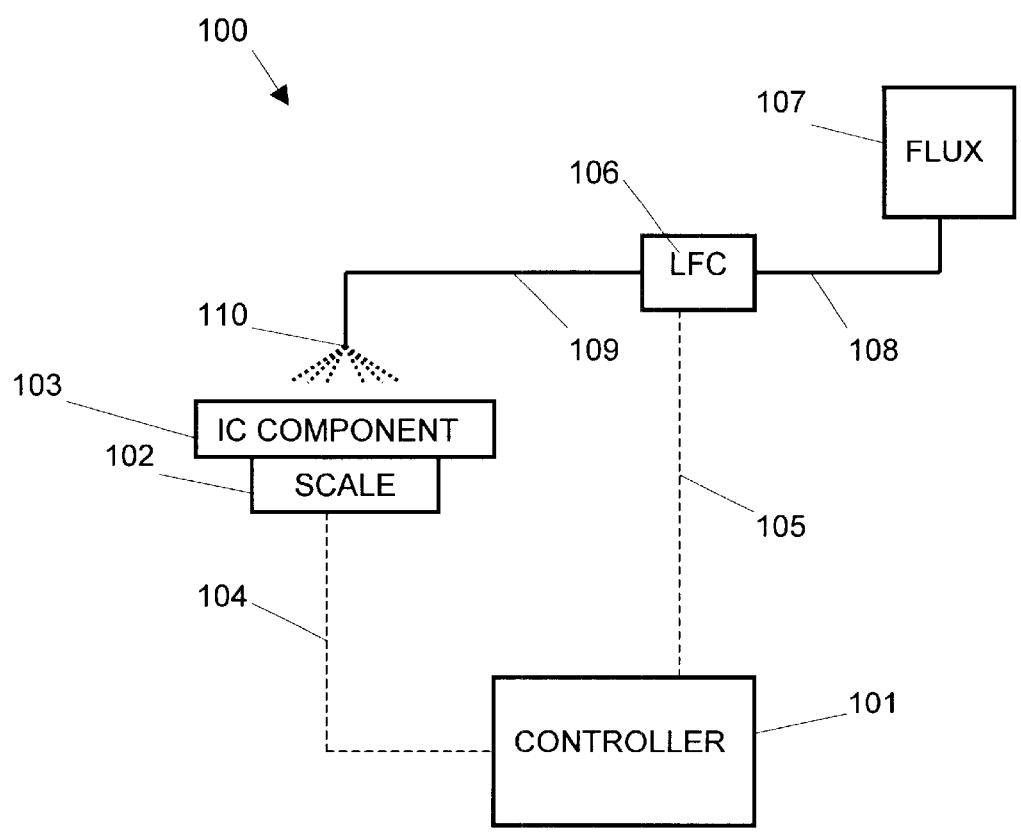
FIG. 1 is a diagram for a description of the inlane flux measuring system.

This invention relates to an apparatus and method for improving the dispensing of flux to a packaging substrate or to a flip-chip die. The apparatus 100 is shown in FIG. 1 and comprises two main components, a controller 101 and a scale 102 means for measuring the weight of a IC component 103 to which the flux is to be applied. The controller is a computer that is capable of computing data from feedback from the scale measuring means 102.

The IC component 103 is placed on scale 102. The IC component could be a flip-chip die having solder bumps or a packaging substrate with conductive traces to which the solder bumps are bonded. The scale 102 can be an electronic scale having an accuracy of ±0.05 mg. The weight data from the scale means 102 is fed by a signal from the scale means through line 104 to the controller 101.

The controller 101 accepts the signal from the scale means and computes the volume amount of flux to be dispensed on the IC component 103. Based on the weight data, the computer determines the volume of flux to be dispensed. A signal is sent from the controller 101 through line 105 to a liquid flow controller (LFC) 106. The signal causes the LFC to open allowing flux from storage container 106 to move through pipes 107 and 108 to spray nozzle 109. The weight of the IC component is monitored through line 104 to controller 101. When the weight reaches a preset limit determined by the controller 101, a signal is sent through line 105 to the LFC to shut off the flow of flux to flux dispensing means 109. The flux dispensing means can be a spray as illustrated in FIG. 1, or the means can be a flux needle, flux brush or flux pad or stamp which are not illustrated in FIG. 1.

The volume of flux dispensed is based on the following formula:

$$\text{volume of flux} \times \text{flux density} = \Delta \text{weight of } IC \text{ component}$$

where $\Delta$ weight is the difference between the initial weight and the weight of the IC component coated with flux. The controller can be preset to dispense a specific volume of flux or preset to dispense flux based on a specific $\Delta$ weight of the IC component. Thus, if the $\Delta$ weight reaches a preset value, the volume determined by the above formula will be dispensed. If the controller presets the volume of flux, then the preset volume will determine the change in weight of the IC component to be measured. When $\Delta$ weight is attained, the controller sends a signal to the LFC to shut off the flow of flux. Thus, the controller 101 is inline, providing a closed loop information for dispensing the flux. Of course, the volume or weight presets can be adjusted as needed in the controller by using high level software control.

FIG. 2 is a block diagram 200 illustrating the method of using the above described apparatus. The flip-chip die 201 is weighed 202 and the weight data is sent to controller 203. The controller sends a signal to the dispensing means to dispense flux 204 onto the die. The weight is continuously monitored 202 and the data fed back to the controller 203 forming a loop. When a preset weight is attained, the controller sends a signal to shut off dispensing flux to the die. This breaks the loop formed between the weighing step 204 and the controller 203 and the signal to dispense the flux. After the dispensing the flux is terminated, the die is placed on packaging substrate 206. The die-substrate assembly is heated to a temperature between about 130° and about 165° C. for about 15 to about 180 minutes to cause the solder bumps to reflow 207 to bond or attached the die to the traces on the substrate. Although not shown, the method would be similar for dispensing flux onto the packaging substrate instead of the die.

While this invention has been described with reference to several preferred embodiments, it is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

What is claimed is:

1. An apparatus for applying flux to an IC component, the apparatus comprising:
    a scale means for weighing the IC component thereon;
    a flux dispensing means positioned in proximity to the IC component for dispensing flux to the IC component based on a measured weight of the IC component;
    a liquid fluid controller means for controlling the volume of flux dispensed; and a controller means for recording the weight of the IC component and sending signals to the liquid fluid control means to control the volume of flux to the IC component in response to the measured weight.

2. The apparatus according to claim 1, wherein the scale means is an electronic scale having an accuracy of ±0.05 mg.

3. The apparatus according to claim 1, wherein the controller is a computer.

4. The apparatus according to claim 1, wherein the dispensing means is a spray flux system, a flux brush, a flux pad, or a flux stamp.

5. The apparatus according to claim 1, wherein the dispensing means is a spray flux system.

6. A method of applying flux to an IC component, the method comprising:
    weighing the IC component to determine weight data for the component;
    feeding the weight data to a controller;
    dispensing a volume of flux to the IC component based a signal from the controller in response to the weight data;
    monitoring the weight of the IC component; and
    terminating the dispensing of the flux.

7. The method according to claim 6, wherein the flux is a rosin.

8. The method according to claim 6, wherein the IC component is a flip-chip die having solder bumps, the method further comprising placing the flip-chip die on a packaging substrate and reflowing the solder bumps.

9. The apparatus according to claim 1, wherein the IC component is a flip-chip die having solder bumps or a packaging substrate with conductive traces.

10. The method according to claim 6, wherein the IC component is a packaging substrate having conductive traces, the method further comprising placing a flip-chip die having solder bumps on the conductive traces and reflowing the solder.

* * * * *